(12) United States Patent
Tokuhiro

(10) Patent No.: US 7,102,553 B2
(45) Date of Patent: Sep. 5, 2006

(54) SIGNAL TRANSMISSION METHOD AND SIGNAL TRANSMISSION DEVICE

(75) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/202,351

(22) Filed: Aug. 10, 2005

(65) Prior Publication Data

US 2006/0012497 A1    Jan. 19, 2006

Related U.S. Application Data

(63) Continuation of application No. PCT/JP2003/004098, filed on Mar. 31, 2003.

(51) Int. Cl.
*H03M 9/00* (2006.01)

(52) U.S. Cl. .................. 341/101; 341/100; 341/103

(58) Field of Classification Search ............... 341/100, 341/101, 103, 95, 50
See application file for complete search history.

(56) References Cited

U.S. PATENT DOCUMENTS 6,307,651 B1 * 10/2001 Ohtani et al. ............... 358/524

FOREIGN PATENT DOCUMENTS

| JP | 355010647 | * | 7/1998 |
| JP | 11-098022 | | 4/1999 |
| JP | 11-145944 | | 5/1999 |
| JP | 2001-103474 | | 4/2001 |

* cited by examiner

*Primary Examiner*—Peguy JeanPierre
(74) *Attorney, Agent, or Firm*—Katten Muchin Rosenman LLP

(57) ABSTRACT

A signal transmission method and a signal transmission device capable of easily transmitting a signal with a small number of signal lines. A data signal of time slot count N+α with bit count N is longitudinal-lateral converted into a data signal of time slot count N with bit count N+α. so as to create a null time α and a control signal is inserted into the null time α, thereby converting the parallel signal containing the data signal and the control signal into a serial signal for transmission.

24 Claims, 14 Drawing Sheets

FIG. 2A 8 time slot

| d00 | d10 | d20 | | d70 |
|---|---|---|---|---|
| d01 | | | | |
| d02 | | | | |
| ⋮ | | | | |
| ⋮ | | | | |
| d06 | | | | |

7 bit (rows)

FIG. 2B 7 time slot | ADDED SLOT

| d00 | d01 | d02 | | d06 |
|---|---|---|---|---|
| d10 | | | | |
| d20 | | | | |
| ⋮ | | | | |
| ⋮ | | | | |
| d70 | | | | |

8 bit (rows)

WHERE K. = Kx.y, A. = Ax.y, D. = Dx.y

SIGNAL TRANSMISSION METHOD AND SIGNAL TRANSMISSION DEVICE

CROSS-REFERENCE TO RELATED APPLICATION

This is a continuation of Application PCT/JP2003/004098, filed on Mar. 31, 2003, now pending, the contents of which are herein wholly incorporated by reference.

BACKGROUND OF THE INVENTION

The present invention relates to a signal transmission technology for transmitting a greater quantity of digital signals via a less number of signal lines on the occasion of transmitting the digital signals in a communication device, an information processing device, etc.

A means for transmitting the greater quantity of digital signals via the less number of signal lines has hitherto been, for example, such a signal transmission method that a parallel-serial converter transmits the parallel signals as serial signals, and the serial signals are serial/parallel-converted on a receiving side, thereby acquiring the original parallel signals.

When the originally-parallel signals are simply rearranged as the serial signals and thus transmitted, a problem arises, wherein a bit order thereof is not stored.

FIG. 14 illustrates this problem. In a case where a transmitting side inputs the parallel signals having a bit count n to a parallel-serial converter 91, signals d11, d21 are inputted in time-series to an input DI1. Further, signals d12, d22 are sequentially inputted to an input DI2, and signals d1n, d2n are sequentially inputted to an input DIn. Then, the parallel-serial converter 91 converts these signals into serial signals DS in such sequences as d11, d12, d13, d14 . . . d1n, d21, d22, and transmits these serial signals.

On the other hand, on the receiving side, a serial/parallel converter 92 converts the received serial signals DS into the parallel signals but is unable to recognize a delimiter of a bit order of the data and therefore converts the signals into the parallel signals delimited by n-bits at proper portions. Accordingly, it follows that the parallel signals having a different bit order from the bit order (the delimiter and an arrangement sequence of the data) of the original parallel signals, are to be regenerated. For instance, the example in FIG. 14 is that a certain train of time slot signals d21 through d2n on the input side becomes signals d1n=1 through d2n−2.

Therefore, for example, a data transmission method was proposed, wherein in the case of transmitting digital video signals as the serial signals, the signals are transmitted in a way that adds a train of data for synchronization on a one-line-data-by-one-line-data basis of the video signals, while on the receiving side, the video signals are regenerated based on the synchronization data train (refer to Patent document 1).

In the case of thus adding the synchronization data train to the data train based on the video signals, it follows that a data size of the data to be transmitted increases corresponding to this addition, and hence the data train having the addition of the synchronization data train (which is a composite data train) is processed with a faster clock than a clock for processing the video signals, resulting in a complicated configuration of the device such as generating different clocks by a PLL (Phase Locked Loop) circuit.

Further, in a large capacity transmission method employing a plurality of the serial transmissions, a delay difference occurs between the serial transmissions, and there is a necessity of absorbing this delay difference.

FIG. 15 is an explanatory diagram showing the delay difference between the serial transmissions. If a delay difference (Δdelay) occurs between the serial transmissions when transmitting plural rows of serial signals, this delay difference appears in received data on the receiving side. This delay difference is allowable if small enough to be compared with a transmission speed, however, an allowable time difference decreases as the transmission speed rises, resulting in a problem.

Patent Document 1

Japanese Patent Application Laid-Open Publication No. 2001-103474

SUMMARY OF THE INVENTION

The present invention is devised in view of the problems of the prior arts described above. Namely, the present invention is possible to provide a technology of easily transmitting the signals via a less number of signal lines.

The present invention adopts the following means in order to solve the problems given above.

A signal transmission method on a transmitting side according to the present invention comprises steps of:

longitudinal-lateral-converting data signals having a time slot count N+α with a bit count N into data signals having a time slot count N with a bit count N+α, and creating null time α;

adding a control signal into the null time α;

converting parallel signals containing the data signals and the control signal into serial signals; and transmitting the serial signals.

Thus, the present invention is that the null time is created by the longitudinal-lateral conversion, and the control signal is added into this null time, whereby even when the data contained in the input parallel signals have no null (idle) time, the control signal indicating a data delimiter can be embedded without any delay. Accordingly, an original bit order can be restored based on the control signal on the receiving side.

Further, in the signal transmission method according to the present invention, the parallel signals may be, after being encoded, converted into the serial signals.

With this contrivance, the signal transmission method of the present invention facilitates detection of the data delimiter by encoding the data signals and the control signals into different code trains.

Moreover, in the signal transmission method according to the present invention, the parallel signals may be encoded by an 8B/10B conversion process.

Furthermore, in the signal transmission method according to the present invention, plural rows of serial signals may be transmitted in parallel.

Still further, in the signal transmission method according to the present invention, the control signals may be added into the plural rows of parallel signals at a predetermined timing.

Yet further, in the signal transmission method according to the present invention, plural types of control signals may be added in a way that changes an add interval for every type thereof.

Moreover, a signal transmission method according to the present invention executes steps of:

receiving serial signals;

converting the serial signals into parallel signals containing a control signal indicating a data delimiter and data signals;

lateral-longitudinal-converting, based on the control signal, data signals having a time slot count N with a bit count N+α into data signals having a time slot count N+α with a bit count N; and outputting the data signals after being converted.

Furthermore, in the signal transmission method according to the present invention, the parallel signals may be decoded.

Additionally, in the signal transmission method according to the present invention, the parallel signals may be decoded by a 10B/8B conversion process.

Yet further, in the signal transmission method according to the present invention, the plural rows of serial signals may be received in parallel.

Still further, in the signal transmission method according to present invention, a delay difference may be obtained based on the control signals added to the plural rows of parallel signals at a predetermined timing, and the plural rows of parallel signals may be outputted based on this delay difference.

Furthermore, in the signal transmission method according to the present invention, a phase difference may be obtained based on plural types of control signals added in a way that changes an add interval for every type thereof.

Moreover, a signal transmission device according to the present invention comprises:

a longitudinal-lateral conversion unit longitudinal-lateral-converting data signals having a time slot count $N+\alpha$ with a bit count $N$ into data signals having a time slot count $N$ with a bit count $N+\alpha$, and creating null time $\alpha$;

a control signal add unit adding a control signal into the null time $\alpha$; and a parallel-serial conversion unit converting parallel signals containing the data signals and the control signal into serial signals, and outputting the serial signals.

Thus, in the signal transmission device of the present invention, the null time is created by the longitudinal-lateral conversion, and the control signal is added into this null time, whereby even when the data contained in the input parallel signals have no null (idle) time, the control signal indicating a data delimiter can be embedded without any delay. Accordingly, an original bit order can be restored based on the control signal on the receiving side.

Further, the signal transmission device according to the present invention may further comprise an encoder encoding the parallel signals.

With this contrivance, the signal transmission device of the present invention facilitates the detection of the data delimiter by encoding the data signals and the control signals into different code trains.

Still further, in the signal transmission device according to the present invention, the encoder may encode the parallel signals by an 8B/10B conversion process.

Yet further, in the signal transmission device according to the present invention, plural rows of serial signals may be transmitted in parallel.

Moreover, in the signal transmission device according to the present invention, the control signal add unit may add the control signals to the plural rows of parallel signals at a predetermined timing.

Additionally, in the signal transmission device according to the present invention, the control signal add unit may add plural types of control signals in a way that changes an add interval for every type thereof.

Furthermore, a signal transmission device according to the present invention comprises:

a serial/parallel-converting unit converting serial signals into parallel signals containing a control signal indicating a data delimiter and data signals; and a lateral-longitudinal-converting unit lateral-longitudinal-converting, based on the control signal, data signals having a time slot count $N$ with a bit count $N+\alpha$ into data signals having a time slot count $N+\alpha$ with a bit count $N$, and outputting the data signals.

Moreover, the signal transmission device according to the present invention may further comprise a decoder decoding the parallel signals.

Further, in the signal transmission device according to the present invention, the decoder may decode the parallel signals by a 10B/8B conversion process.

Still further, in the signal transmission device according to the present invention, the receiving unit may receive the plural rows of serial signals in parallel.

Yet further, the signal transmission device according to the present invention may further comprise a delay adjusting unit obtaining a delay difference on the basis of the control signals added at a predetermined timing to the plural rows of parallel signals, and adjusting this delay difference.

Moreover, in the signal transmission device according to the present invention, the delay adjusting unit may obtain a phase difference on the basis of the plural types of control signals added in a way that changes an add interval for every type thereof.

BRIEF DESCRIPTION OF THE DRAWINGS

FIG. 2 is an explanatory diagram of a longitudinal-lateral conversion;

DETAILED DESCRIPTION OF THE PREFERRED EMBODIMENT

Embodiments of the present invention will hereinafter be described with reference to the accompanying drawings.

First Embodiment

§1. Configuration of Device

Figure 1:
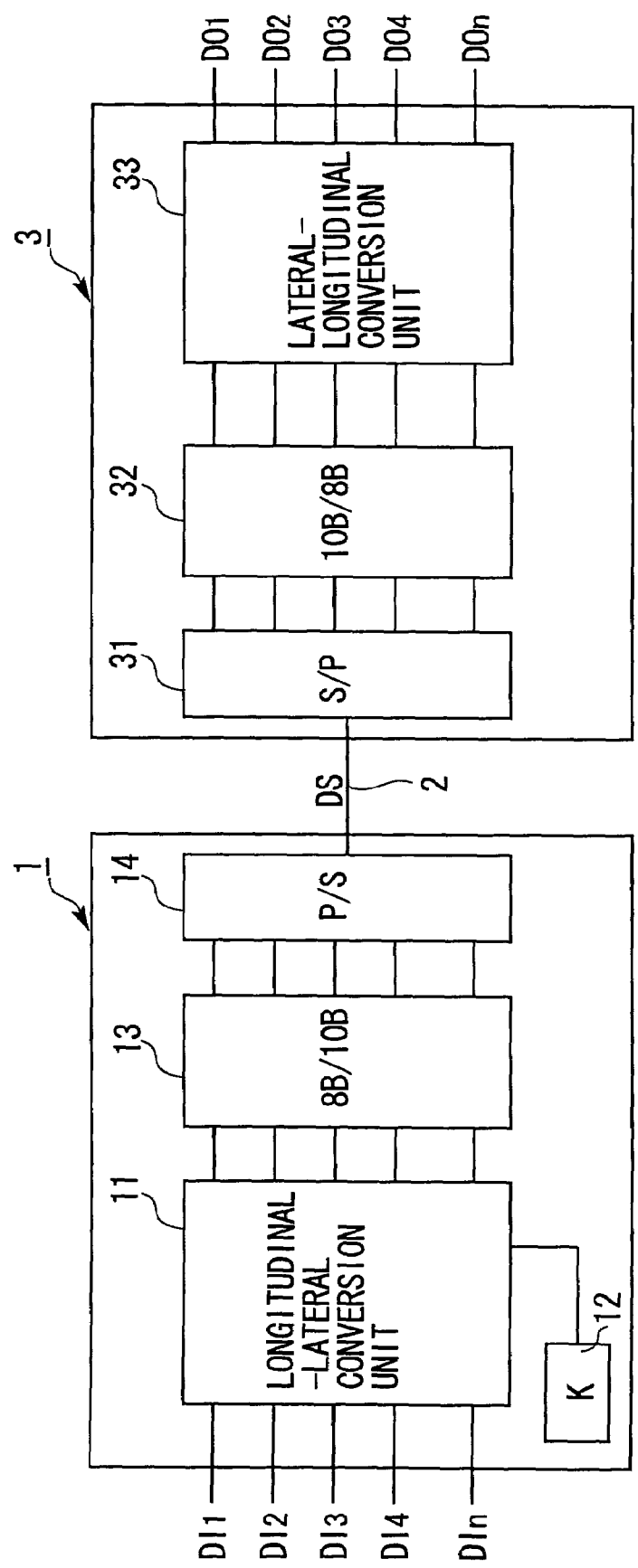
FIG. 1 is an explanatory diagram of a signal transmission device as one embodiment of the present invention.

FIG. 1 is an explanatory diagram showing a signal transmission device by way of one embodiment of the present invention.

As shown in FIG. 1, in the first embodiment, a signal transmission device 1 on a transmitting side converts parallel signals into serial signals by a time division multiplexing method, and transmits the serial signals via one signal line 2 to a signal transmission device 3 on a receiving side. This enables the parallel signals to be transmitted between boards via a less number of signal lines.

The transmitting-side signal transmission device 1 includes a longitudinal-lateral conversion unit 11, a control signal add unit 12, an encoder 13 and a parallel-serial conversion unit (which is also abbreviated to P/S) 14.

The longitudinal-lateral conversion unit 11 longitudinal-lateral-converts data signals having a time slot count $N+\alpha$ with a bit count N into data signals having a time slot count N with a bit count $N+\alpha$, thereby creating null time $\alpha$. Note that the data signals having a time slot count 7+1 with a bit count 7 as shown in FIG. 2(A) are converted into data signals having a time slot count 7 with a bit count 7+1 as shown in FIG. 2(B) in the first embodiment. Parallel data having 8 time slots can be thereby transmitted as parallel data having 7 time slots, where by the null time for one time slot is acquired.

The control signal add unit 12 adds a control signal into this null time.

The encoder 13 encodes the parallel signals (8 bits) containing the data signals and the control signal. In the first embodiment, the 8-bit data are converted into 10-bit codes by processing based on a known 8B/10B converting process such as an 8B/10B conversion rule by IBM Corp. and 1000BASE-X Standards.

Then, the P/S 14 converts the parallel signals into the serial signals.

Further, the receiving-side signal transmission device 3 includes a serial/parallel conversion unit (which will also be abbreviated to S/P) 31, a decoder 32 and a lateral-longitudinal conversion unit 33.

The S/P 31 converts the serial signals into the parallel signals containing the control signal showing a delimiter of the data and the data signals as well.

The decoder 32 decodes the parallel signals. In the first embodiment, the parallel signals are decoded by the known 10B/8B converting process. The 10-bit codes are decoded into the 8-bit data by the processing reversed to the encoding described above.

The lateral-longitudinal conversion unit 33 lateral-longitudinal-converts, based on the control signal, the data signals having the time slot count N with the bit count $N+\alpha$ into the data signals having the time slot count $N+\alpha$ with the bit count N.

§2. Signal Transmission Method

Next, a signal transmission method in the signal transmission device having the configuration described above will be explained.

The transmitting-side signal transmission device 1, to begin with, converts data for 8 time slots of 7-bit parallel signals DI1–DI7 into 8-bit parallel data DI1–DI8 by use of the longitudinal-lateral conversion unit 11, then adds control signals (value K, 8 bits) inputted from the control signal add unit 12 into null time slots, and outputs the signals to the encoder 13.

The encoder 13 encodes the 8-bit parallel signals into a 10-bit code train (the parallel signals), and outputs the code train to the P/S 14. This makes the data delimiter distinguishable when converting the parallel signals into the serial signals.

For instance, if the 8-bit data are simply rearranged serially and thus transmitted, the data delimiter is undistinguishable to the receiving side, and the same 8-bit data can not be obtained by the receiving side. Such being the case, a scheme is that the codes for control (the control codes) in addition to the codes representing the 8-bit data (the data codes) can be added by converting the 8-bit (namely, 256 patterns) data into a train of 10-bit (namely, 1024 patterns) codes. The code train contains totally 512-tuples (256×2) as the data codes and 20-tuples (10×2) as the control codes. The code train acquired by the 8B/10B conversion has a characteristic that normally a maximum number of sequences of 0 or 1 comes to only 4. Especially 6-tuples (3×2) among the control codes are called comma codes, and there exists a case in which the number of sequences of 0 or 1 comes to 5 only when transmitting these comma codes. The receiving side judges a byte delimiter of the serial data by detecting this, and thus restores a bit order.

The P/S 14 converts the 8B/10B-converted code train into the serial signals, and transmits the serial signals via the signal line 2.

On the other hand, the receiving-side signal transmission device 3, at first, converts the transmitted serial signals into the 10-bit parallel signals by use of the S/P 31, and outputs the parallel signals to the decoder 32. At this time, the receiving-side signal transmission device 3 determines a parallel conversion timing by detecting the comma codes added by the transmitting side.

The decoder 32 restores the 10-bit parallel signals back to the 8-bit parallel signals by the 10B/8B conversion, and outputs the 8-bit parallel signals to the lateral-longitudinal conversion unit 33.

Then, the lateral-longitudinal conversion unit 33 lateral-longitudinal-converts the data signals for the 7 time slots that are delimited by the control signals among the 8-bit parallel signals, into 8-time-slot data of the original 7-bit parallel signals, and outputs these 7-bit parallel signals DO1–DO7 to a circuit provided at a posterior stage.

As described above, according to the first embodiment, it is possible to execute the transmission enabling the original bit order to be restored with no delay of the parallel signals containing the control signals by adding the control signals for reproducing the bit order into the null time created by the longitudinal-parallel conversion.

Particularly in the first embodiment, the parallel signals containing the control signals can be processed with any clock-up, and hence the transmission can be done with a simple configuration.

Second Embodiment

The signal transmission device according to a second embodiment of the present invention will be described with reference to FIGS. 3 through 6.

The first embodiment has exemplified the configuration for transmitting one line of serial signals, however, the second embodiment will exemplify parallel transmissions of plural rows of serial signals. Note that the configuration for transmitting the respective serial signals is the same as in the first embodiment, and therefore the repetitive explanations are omitted as by marking the same components with the same numerals, and so forth.

§1. Configuration of Device

Figure 3:
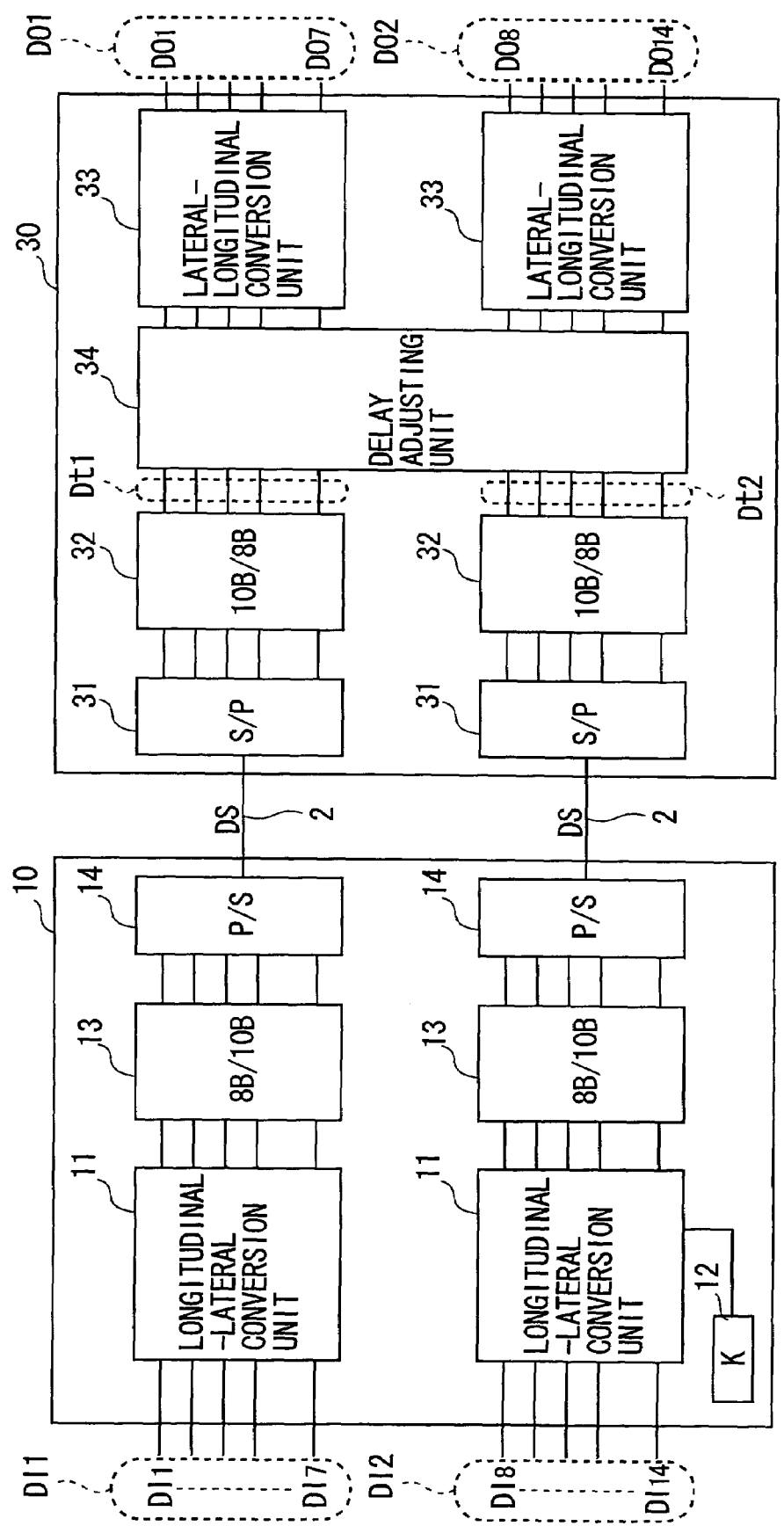
FIG. 3 is a schematic diagram of the signal transmission device in the present embodiment.

FIG. 3 is a schematic diagram of the signal transmission device in the second embodiment. As shown in FIG. 3, a transmitting-side transmission device 10 includes the longitudinal-lateral conversion units 11, the encoders 13, the parallel-serial conversion units 14 by pluralities (two pieces each in this example), which are the same as those described above. The transmitting-side signal transmission device 10 converts the parallel signals DI1–DI14 into plural rows of serial signals DS1 and DS2, and transmits the serial signals in parallel (parallel transmissions).

On the other hand, the receiving-side signal transmission device 30 includes the serial/parallel conversion units (S/P) 31, the decoders 32 and the lateral-longitudinal conversion units 33 by pluralities (two pieces each in this example), and further has a delay adjusting unit 34 for adjusting a delay difference between the serial signals.

The signal transmission device 10 in the second embodiment inputs the control signals given from the control signal add unit 12 to the parallel signals DI1–DI7 and DI8–DI14 at the same timing, which are inputted to the plurality of longitudinal-lateral conversion units 11. Owing to these control signals inputted, the receiving-side signal transmission device 30, when receiving the plural rows of serial signals DS1 and DS2, recognizes a delay difference Δdelay between the respective serial signals DS1 and DS2 on the basis of the control signals, and can acquire the parallel signals DO1–DO14 on a proper bit order by adjusting this delay difference.

§2. Delay Difference Adjusting Method

Figure 4:
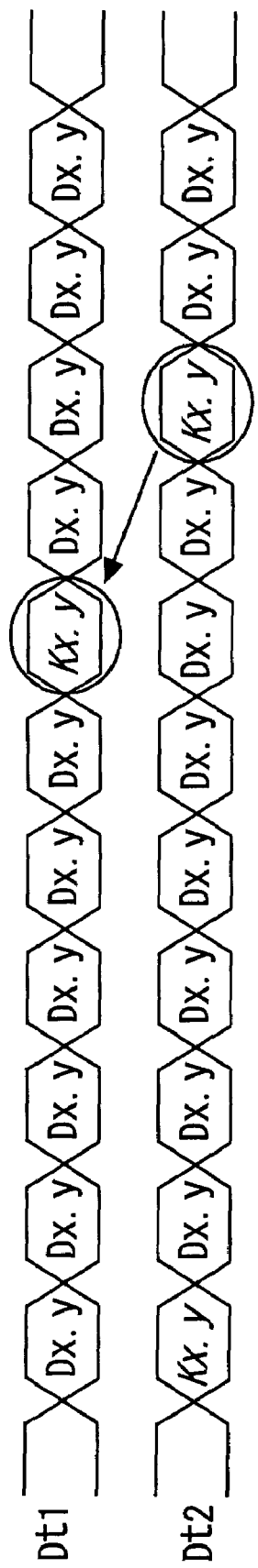
FIG. 4 is an explanatory diagram showing a delay difference between serial signals.

FIG. 4 is an explanatory diagram showing the delay difference between the serial signals. FIG. 4 shows parallel signals Dt1, Dt2 after being decoded by the decoder 32, wherein Dx.y represents a data signal, and Kx.y represents a control signal.

As stated above, the control signals are added once at the same timing into 8 time slots with respect to the parallel signals DI1, DI2. Accordingly, the signals on the same data order as the transmission source has by making the adjustment so that the control signals are rearranged to the same time slots with respect to also the parallel signals Dt1, Dt2.

Figure 5:
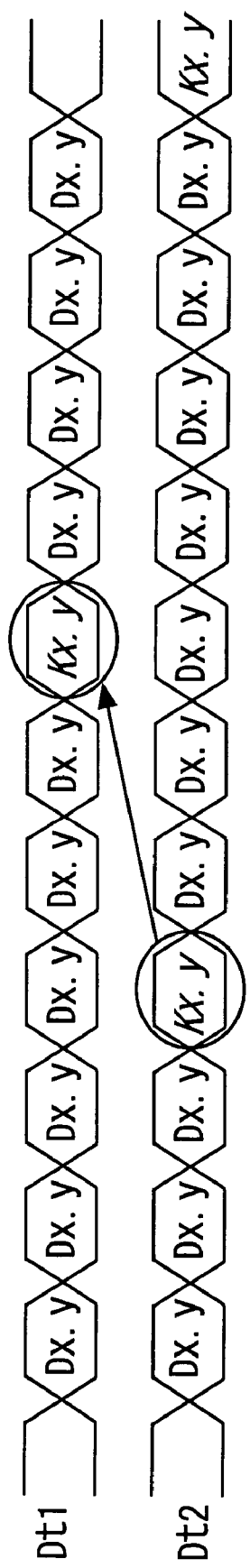
FIG. 5 is an explanatory diagram showing the delay difference between the serial signals.

Note that the control signals closest to each other are rearranged when adjusting the control signals. Namely, an example in FIG. 4 is that the control signal of the parallel signal Dt2, it can be recognized, more advances by 2 time slots than the control signal of the parallel signal Dt1, and therefore the adjustment is made so that the parallel signal Dt2 is more delayed by the 2 time slots than the parallel signal Dt1. Similarly, an example in FIG. 5 is that the control signal of the parallel signal Dt2 is, it can be recognized, more delayed by 3 time slots than the control signal of the parallel signal Dt1, and hence the adjustment is made so that the parallel signal Dt1 gets more delayed by the 3 time slots than the parallel signal Dt2.

§3. Configuration of Delay Adjusting Unit

Figure 6:
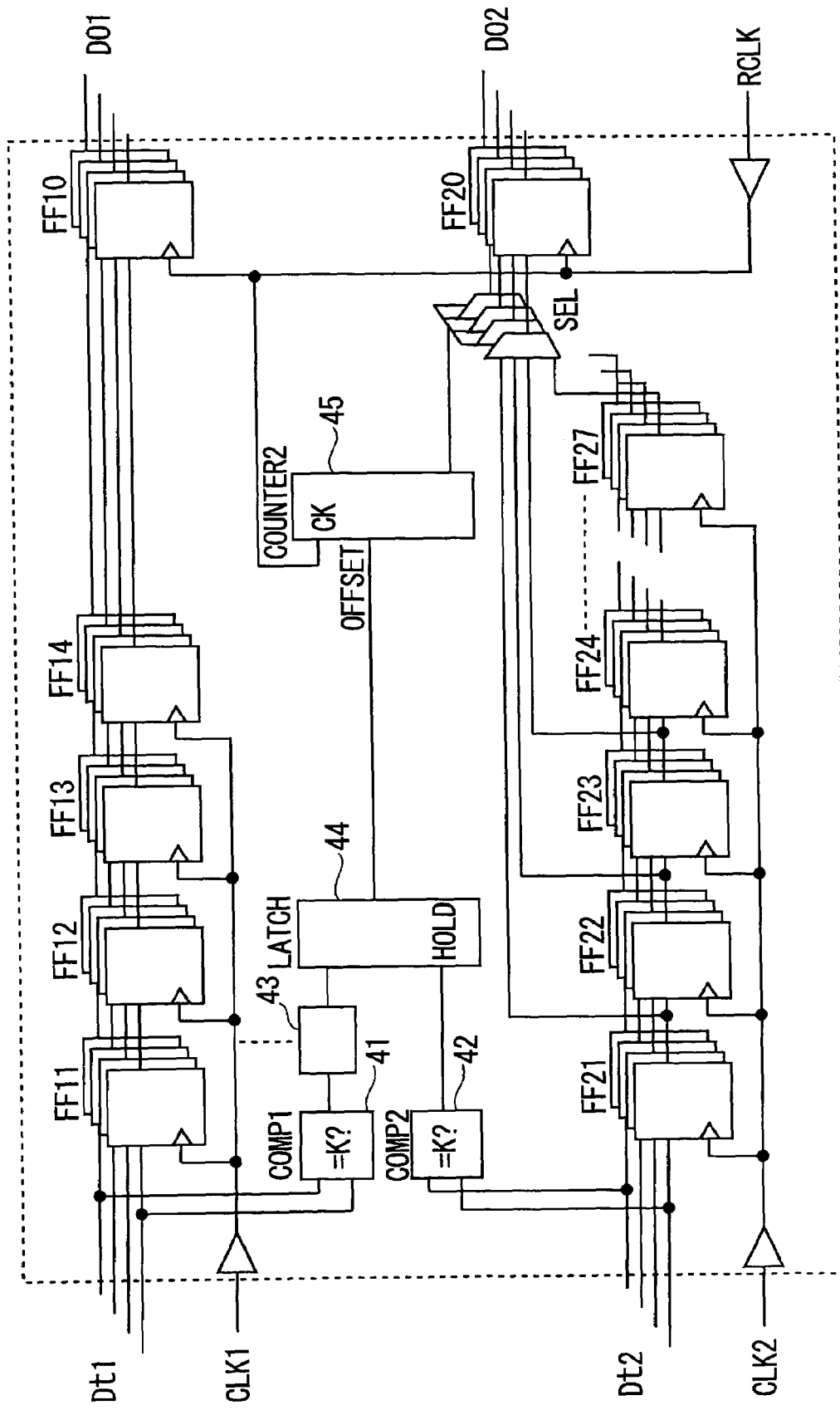
FIG. 6 is a diagram showing a specific configuration of a delay adjusting unit.

FIG. 6 shows a specific configuration of the delay adjusting unit 34 executing the delay adjustment described above.

The parallel signals Dt1, Dt2 that should be subjected to the delay adjustment, when inputted to the delay adjusting unit 34, are outputted respectively via shift registers (F/Fs).

At this time, the parallel signals Dt1 on the reference side are, after being transmitted to four pieces of shift registers FF11 through FF14 in sequence at a timing corresponding to a clock CLK1 on a data-by-data basis (an 8-bit-by-8-bit basis in this example) of one time slot, stored on the shift register FF10 disposed at a final stage and outputted simultaneously with the data on the adjusting side.

On the other hand, the parallel signals Dt2 on the adjusting side is transmitted to seven pieces of shift registers FF21 through FF27 in sequence at a timing corresponding to a clock CLK2 on the data-by-data basis of one time slot, and, among these pieces of data, the data of the shift register selected by a selector SEL is stored on the shift register FF20 at a final stage and outputted simultaneously with the data on the reference side.

Each of a COMP (comparator) 41 and a COMP 42 judges whether the input data is the control signal or not, and, when judging that the input data is the control signal, outputs the signal to the next stage.

A counter 43, when receiving the signal outputted from the COMP 41, resets a counter value. Thereafter, the counter 43 counts up based on the clock CLK1 and outputs a count-up value to a latch 44.

The latch 44 receives the output from the counter 43 and, in the case of receiving the signal from the COMP 42, retains this value. Namely, it is possible to measure a period of time (an offset value) till the control signal of the parallel signals Dt2 is inputted since the control signal of the parallel signals Dt1 has been inputted.

The counter 45 determines a delay difference of the parallel signals Dt2 in accordance with the offset value outputted from the latch 44, and outputs this delay difference to the selector SEL. The selector SEL selects one of the shift registers FF21 through FF27, corresponding to this delay difference, and outputs the data from this selected shift register to the shift register FF20. At this time, the delay difference is, as described above, a difference with respect to the closest control signal. Hence, if the offset value is 1, the delay is +3, if the offset value is 5, the delay is −1 (advance for one time slot), and if the offset value is 7, the delay is −3. Then, based on these delay differences −3 through +3, the selector SEL selects the shift register FF24 if the delay difference is 0, the shift register FF23 if the delay difference is +1, the shift register FF21 if the delay difference is +3, the shift register FF24 if the delay difference is −1, and the shift register FF27 if the delay difference is −3, respectively.

Through these selections, the data with the delay difference adjusted are outputted from the shift registers FF10, FF20 and are lateral-longitudinal-converted, thereby obtaining parallel signals DO1, DO2 on the same bit order as the original parallel data DI1, DI2 have.

As described above, according to the second embodiment, the signals can be transmitted on the proper bit order by adjusting the delay difference when the serial signals are transmitted in parallel.

Note that the delay adjusting unit 34 makes the delay adjustment based on the control signals of the parallel signals Dt1, Dt2 given from the decoder 32 in the second embodiment, however, the delay adjustment may also likewise be made based on the comma codes of the parallel signals given from the S/P 31. In this case, however, the data of the one time slot are the 10-bit data, and hence the shift register is so configured as to be capable of storing the 10-bit data as one word at one time.

FIRST MODIFIED EXAMPLE

In the embodiments described above, the delay adjustment is made by use of the control signals added on the 8-bit-by-8-bit basis. The embodiment of the present invention is not, however, limited to this signal addition. For example, plural types of control signals may also be added in a way that changes an add interval for every type of control signal.

Figure 7:
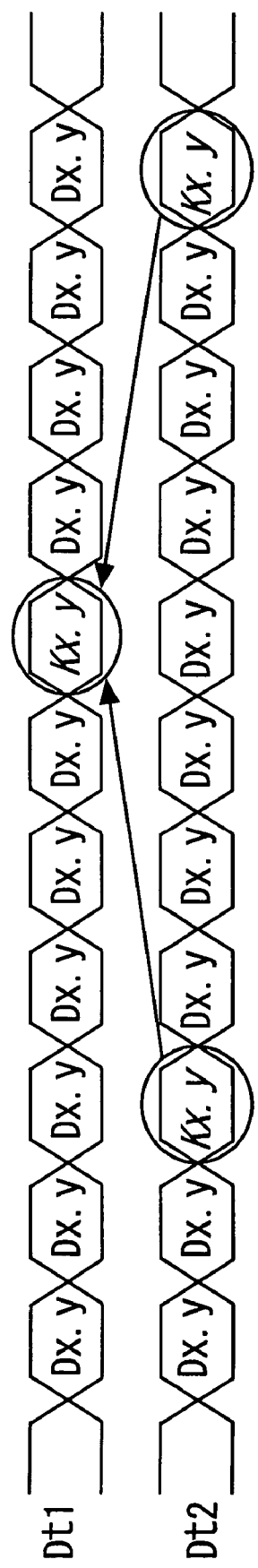
FIG. 7 is an explanatory diagram showing the delay difference between the serial signals.

In the embodiments discussed above, the control signals are added on the 8-bit-by-8-bit basis, and therefore the delay of ±3 time slots is an adjustable delay limit. This is because if a delay of ±4 time slots or larger occurs as shown in FIG. 7, it is impossible to recognize which control signals should be rearranged.

Accordingly, a contrivance of this modified example is that there are added the control signal indicating the data delimiter when effecting the lateral-longitudinal conversion and plural types of control signals as the control signals for the delay adjustment, and the limit of the delay adjustment is enhanced by setting long the add interval of the control signal for the delay control.

Namely, the data signals having the time slot count N+α with the bit count N are longitudinal-lateral-converted into the data signals having the time slot count N with the bit count N+α; and, in the case of adding the control signal for every N+α time slots, the control signal for the delay adjustment is added for every M(N+α) time slots, and the control signal indicating the data delimiter is added for every N+α time slots other than the above (where M is an integer equal to or larger than 2).

Figure 8:
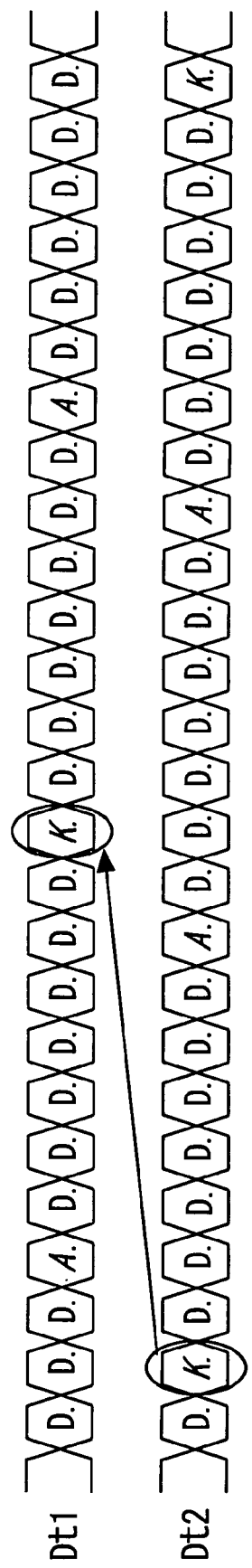
FIG. 8 is an explanatory diagram of a control signal indicating a data delimiter.

FIG. 8 shows an example of adding a control signal Ax.y indicating the data delimiter for every 8 time slots and a delay adjustment control signal Kx.y for every 24 time slots. (Namely, M=3)

In this case, the control signal add unit 12 outputs and adds the control signals Ax.y into the parallel signals DI1, DI2 for every 8 time slots, and outputs and adds the control signals Kx.y as a substitute for the control signal Ax.y into the parallel signals DI1, DI2 for every 24 time slots.

The encoder 13 encodes the different types of control signals into the comma codes of such types as to respectively correspond thereto.

The transmitting-side signal transmission device 10, in which other configurations are the same as those in the embodiments described above, converts the post-encoded parallel signals into the serial signals DS1, DS2 and transmits these serial signals.

On the other hand, in the receiving-side signal transmission device 30, after the S/P 31 has converted the received serial signals into the parallel signals, the decoder 32 decodes the signals, and the different types of comma codes are converted respectively into the control signals (Ax.y, Kx.y) corresponding thereto.

The delay adjusting unit 34 adjusts the delay difference between the post-decoded parallel signals Dt1 and Dt2 on the basis of the control signal Kx.y. The delay adjusting unit 34 in this example is different in terms of a point that the number of shift registers is increased corresponding to how much the add interval of the control signal Kx.y elongates. Therefore, the parallel signals Dt1 on the reference side are, after being transmitted in sequence to twelve pieces of shift registers at the timing corresponding to the clock CLK1 on the data-by-data basis of one time slot, stored on the shift register FF10 at the final stage and outputted simultaneously with the data on the adjusting side.

On the other hand, the parallel signals Dt2 on the adjusting side are transmitted in sequence to twenty three pieces of shift registers at a timing corresponding to the clock CLK2 on the data-by-data basis of one time slot, and the data of the shift register selected by the selector SEL on the occasion of being transmitted are stored on the shift register at the final stage and outputted simultaneously with the data on the reference side.

In this example, if the offset value is 1, the delay is +11, if the offset value is 13, the delay is −1 (advance for one time slot), and if the offset value is 23, the delay is −11. Then, based on these delay differences −1 through +11, the selector SEL selects the 12th shift register from the input side if the delay difference is 0, the 11th shift register if the delay difference is +1, the 1st shift register if the delay difference is +11, the 13th shift register if the delay difference is −1, and the 23rd shift register if the delay difference is −11, respectively.

Then, the parallel data after the delay adjustment are lateral-longitudinal-converted by the lateral-longitudinal conversion unit 33. At this time, the lateral-longitudinal conversion unit 33 recognizes the control signals (Ax.y, Kx.y) added for every 8 time slots as the data delimiters, and effects the lateral-longitudinal conversion into the 7-bit 8 time slot data.

As described above, according to the present example, the control signal for the delay adjustment is added separately from the control signal indicating the data delimiter of the longitudinal-lateral conversion, and it is therefore feasible to adjust the delay at a long interval (±11 time slots in this example) without depending on the data delimiter of the longitudinal-lateral conversion.

It is to be noted that the control signal is not limited to the two types of control signals, and three or more types of control signals may also be added. For instance, the data signals having the time slot count N+α with the bit count N are longitudinal-lateral-converted into the data signals having the time slot count N with the bit count N+α, and the control signal is added for every N+α time slots, in which case the control signals for the delay adjustment are added for every M(N+α) time slots and every (N+α) time slots, and the control signal indicating the data delimiter is added for every N+α time slots other than the above (L>M, where M is an integer equal to or larger than 2, L is an integer larger than 2). Namely, the control signals are added at the interval of 8 time slots, wherein among these control signals, a first delay adjustment control signal is added at an interval of 24 time slots, and a second delay adjustment control signal is added at an interval of 100 time slots. With this contrivance, the delay adjusting unit of the receiving-side transmission device employs the second delay adjustment control signal if capable of making the adjustment for 100 time slots (±49 time slots) and employs the first delay adjustment control signal if capable of making the adjustment for 24 time slots, thus enabling the delay adjustment interval to be changed corresponding to a capacity of the delay adjusting unit on the receiving side.

SECOND MODIFIED EXAMPLE

The embodiment described above has exemplified the example where the delay adjusting unit 43 is constructed of the shift registers. The present invention is not, however, limited to the shift register. The present second modified example is that the delay adjusting unit 43 is constructed of RAMs.

Figure 9:
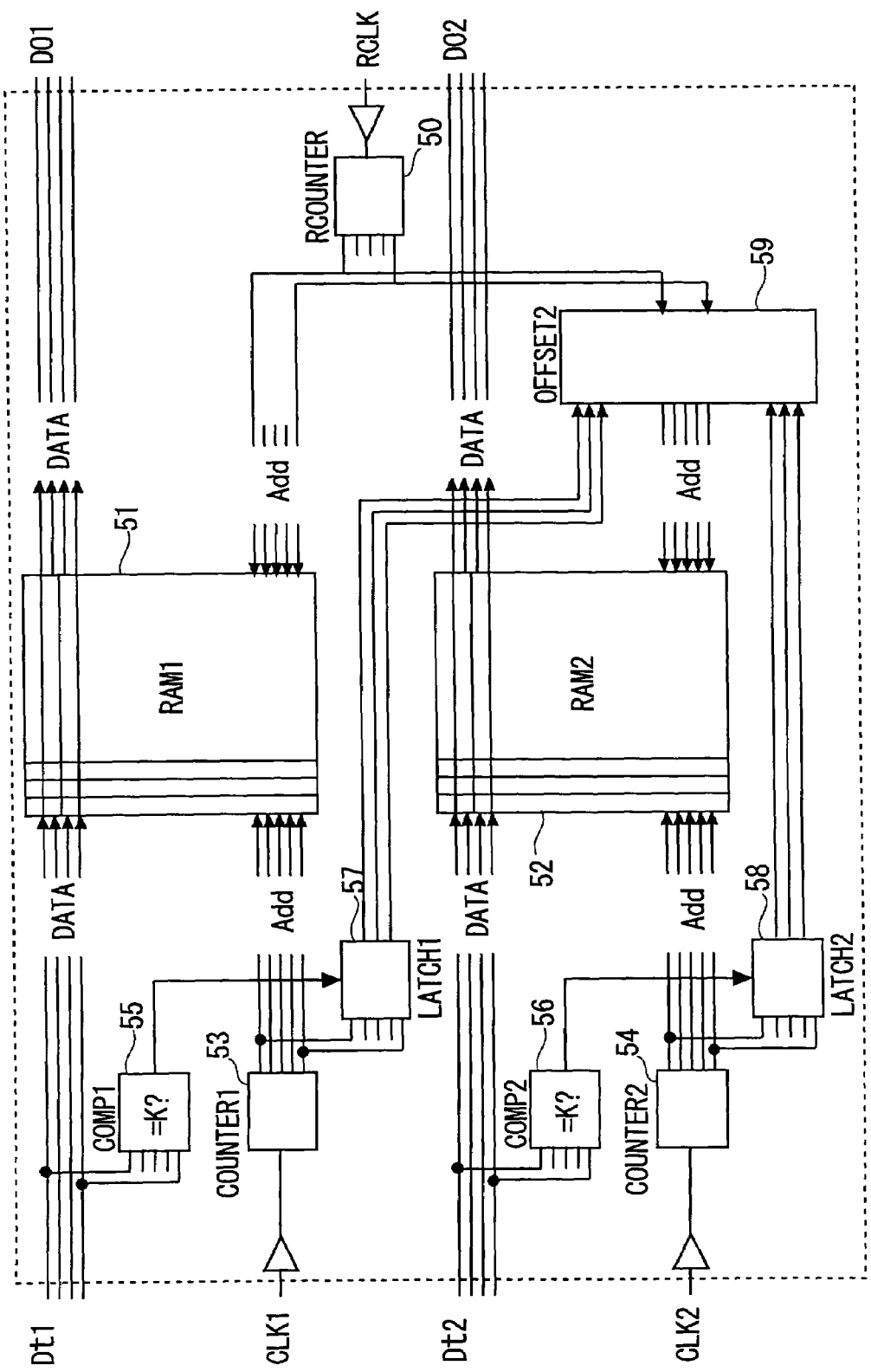
FIG. 9 is a diagram showing a specific configuration of a delay adjusting unit 34 in a second modified example.

FIG. 9 shows a specific configuration of the delay adjusting unit 43 in the present second modified example.

The parallel signals Dt1, Dt2, which should be subjected to the delay adjustment, are, when inputted to the delay adjusting unit 34, stored respectively in a RAM 51 and a RAM 52, and invoked and outputted at a timing when adjusting the delay difference.

At this time, the parallel signals Dt1, Dt2 on the reference side are inputted at a timing corresponding to the clock CLK1 on the data-by-data basis of one time slot, and along with this, the counters 53, 54 generate and input write addresses to the RAMs 51 and 52, wherein the time slot data are written to these addresses. The counters 53, 54 perform the count-up each time the clocks CLK1, CLK2 are inputted, then generate the write addresses, and store the RAMs 51, 52 with the one time slot data of the parallel signals Dt1 (the storage is, however, looped around back to the first address when reaching the last address of the RAM).

Each of a COMP (comparator) 55 and a COMP 56 judges whether the input data is the control signal or not, and, when judging that the input data is the control signal, outputs the signal to the next stage.

Latches 57, 58 receive inputs of the addresses from the counters 53, 54 and, when receiving the output signals from the COMP 55 and COMP 56, retain these address values.

A RCOUNTER 50 counts up in accordance with a readout clock RCLK and generates a readout address of the RAM 1.

A differential circuit 59 obtains a delay difference from a difference between the values (addresses) retained by the latches 57, 58, and outputs a value acquired by adding this difference value to a value in the RCOUNTER 50 as a readout address of the RAM 52.

For example, in a case where the control signal is added at the interval of 100 time slots and the RAMs 51 and 52 have addresses starting with an address No. 1 and ending with an address No. 100, if the control signal on the reference side has an address No. 40 and the control signal on the adjusting side has an address No. 70, the RCOUNTER 50 inputs, to the RAM 51, a value (address No. 90) with which the address on the reference side is smaller by a half of the capacity of the RAM 51 than the address No. 40, as the readout address. Further, the differential circuit 59 inputs, to the RAM 52, an address, i.e., an address No. 20 delayed by the delay difference (+No. 30) from the address No. 90 as the readout address.

Third Embodiment

§1. Configuration of Device

The signal transmission device according to a third embodiment of the present invention will hereinafter be described with reference to FIGS. 10 through 13.

Each of signal transmission devices 60, 70 in the third embodiment is a general type of computer including a CPU and a memory, and transmits the signals via a less number of signal lines (transmission paths) in a way that converts the parallel signals into the serial signals by processing of an arithmetic processing unit based on a signal transmission program.

Figure 10:
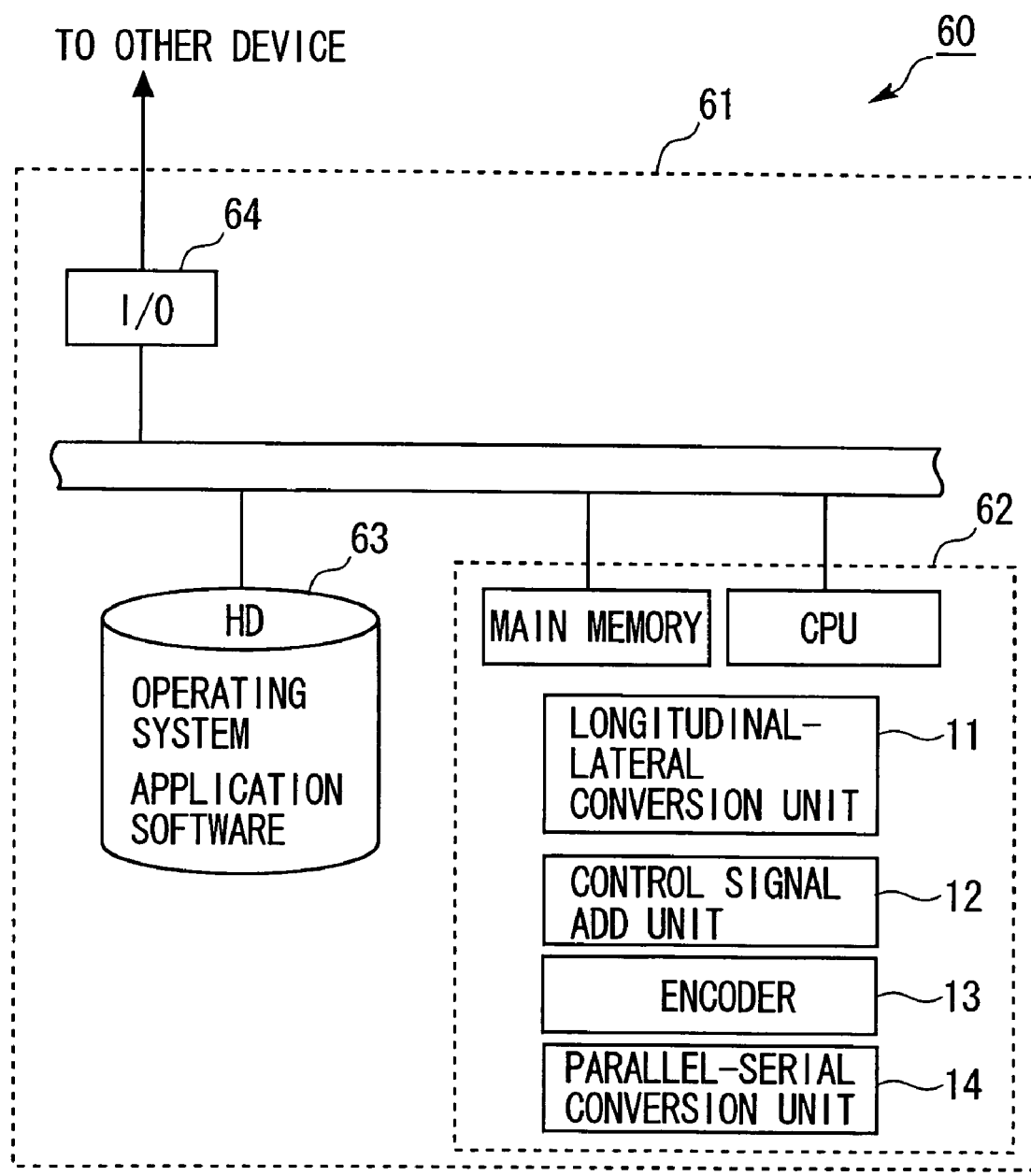
FIG. 10 is a schematic diagram of a configuration of a signal transmission device 60 on a transmitting side.

FIG. 10 is a schematic diagram of a configuration of the transmitting-side signal transmission device 60. The signal transmission device 60 has a main body 61 provided inside with an arithmetic processing unit 62 constructed of a CPU (Central Processing Unit), a main memory, etc., a storage device (hard disc) 63 stored with data and software for arithmetic processing, an input/output (I/O) unit 64 and so on.

The I/O unit 64 has an input port to which the parallel signals are inputted from other devices, and an output port from which the serial signals are outputted to the transmission path.

The storage device 63 is preinstalled with an operating system (OS) and application software (a signal transmission program).

The arithmetic processing unit 62 executes the arithmetic processing based on the signal transmission program, thereby functioning as the longitudinal-lateral conversion unit 11, the control signal add unit 12, the encoder 13 and the parallel-serial conversion unit (which will also be abbreviated to P/S) 14.

The longitudinal-lateral conversion unit 11 longitudinal-lateral-converts data signals having a time slot count N+α with a bit count N into data signals having a time slot count N with a bit count N+α, thereby creating null time α. Note that the data signals having a time slot count 7+1 with a bit count 7 as shown in FIG. 2(A) are converted into data signals having a time slot count 7 with a bit count 7+1 as shown in FIG. 2(B) in the third embodiment. Parallel data having 8 time slots can be thereby transmitted as parallel data having 7 time slots, where by the null time for one time slot is acquired.

The control signal add unit 12 adds the control signal into this null time.

The encoder 13 encodes the parallel signals (8 bits) containing the data signals and the control signal. In the third embodiment, the encoding is executed based on the known 8B/10B converting process.

Then, the P/S 14 converts the parallel signals into the serial signals.

Figure 11:
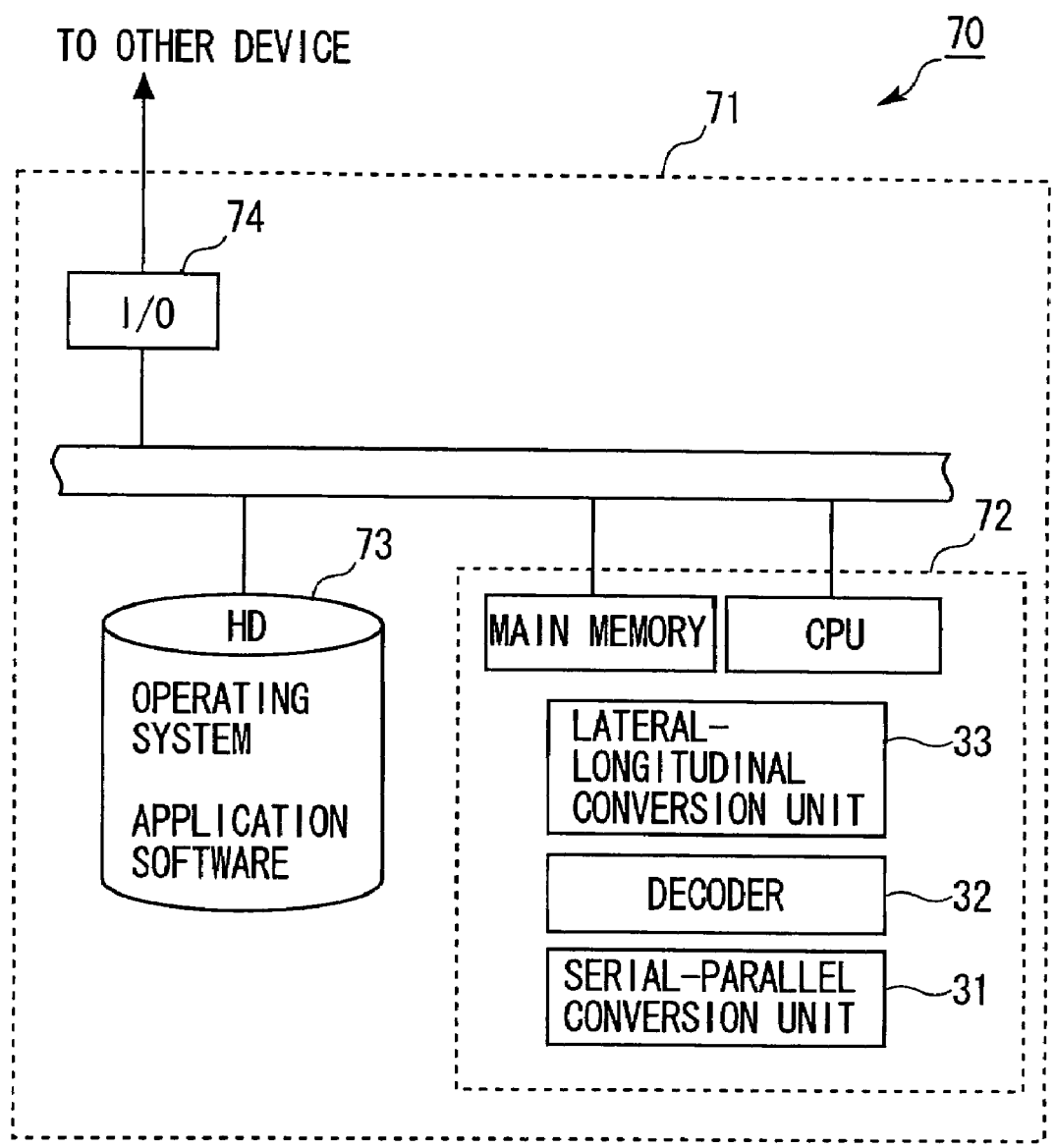
FIG. 11 is a schematic diagram of a configuration of a signal transmission device 70 on a receiving side.
Figure 12:
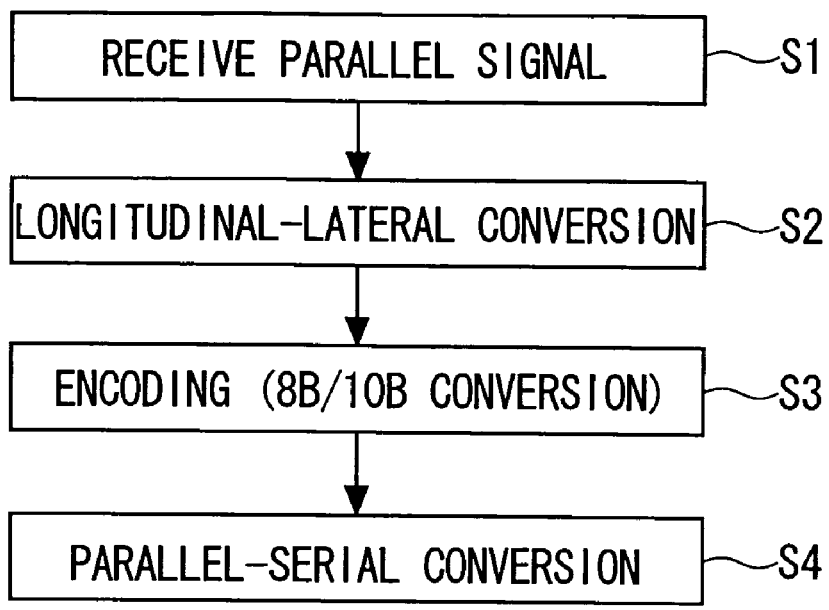
FIG. 12 is an explanatory diagram of a signal transmission method.
Figure 13:
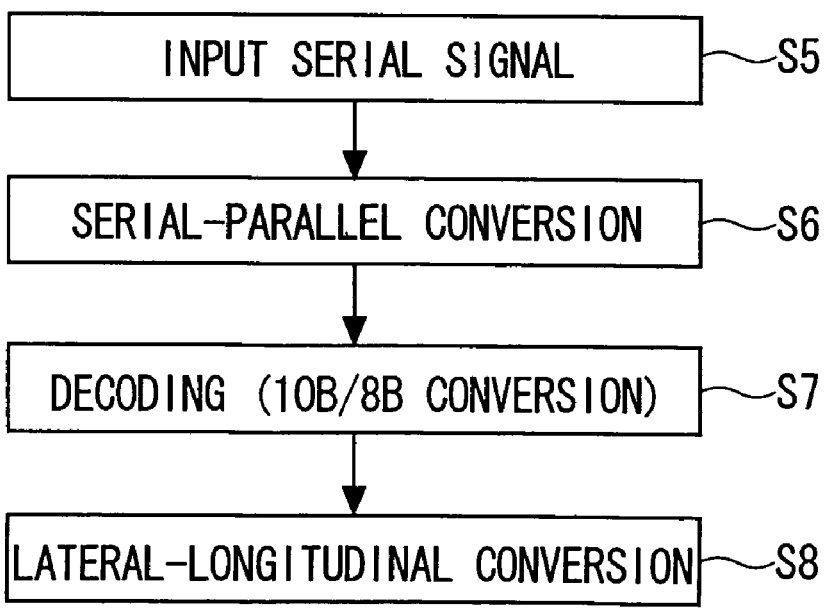
FIG. 13 is an explanatory diagram of the signal transmission method.
Figure 14:
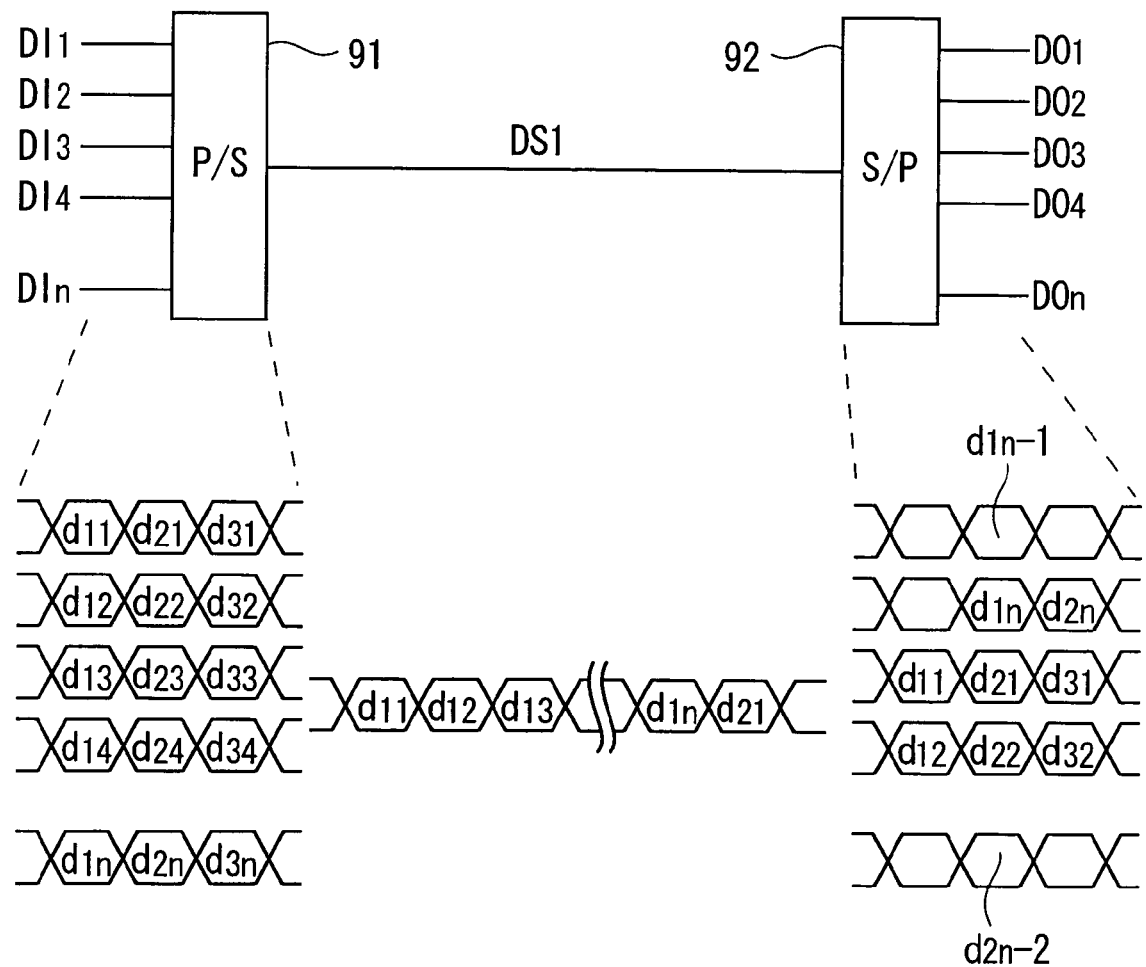
FIG. 14 is an explanatory diagram showing a problem that a bit order is not stored.
Figure 15:
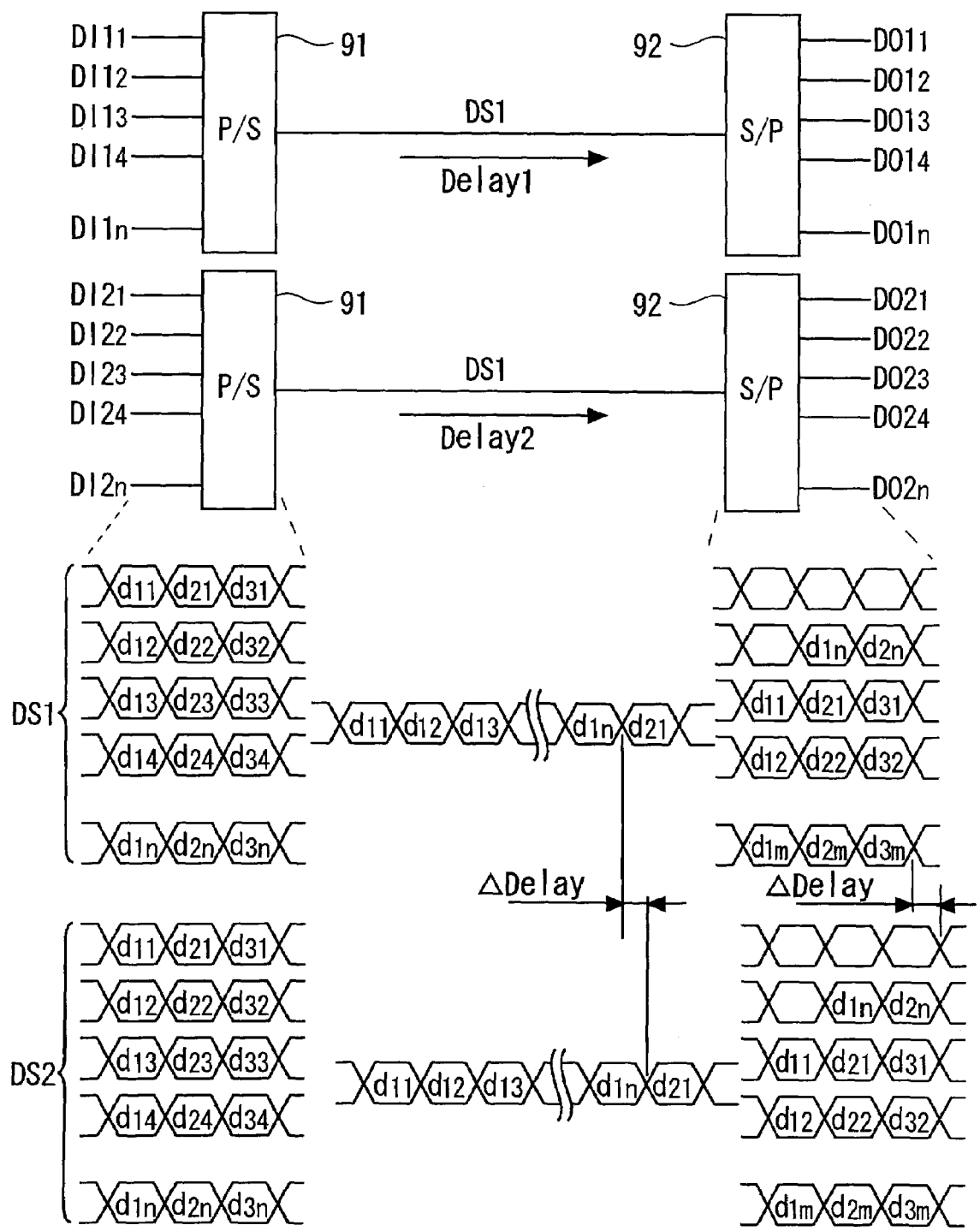
FIG. 15 is an explanatory diagram showing a delay difference between serial transmissions.

On the other hand, FIG. 11 is a schematic diagram of a configuration of the receiving-side signal transmission device 70. The signal transmission device 70 has a main body 71 provided inside with an arithmetic processing unit 72 constructed of a CPU (Central Processing Unit), a main memory, etc., a storage device (hard disc) 73 stored with data and software for the arithmetic processing, an input/output (I/O) unit 74 and so on.

The I/O unit 74 has an input port to which the parallel signals are inputted from other devices, and an output port from which the serial signals are outputted to the transmission path.

The storage device 73 is preinstalled with an operating system (OS) and application software (a signal transmission program).

The arithmetic processing unit 72 executes the arithmetic processing based on the signal transmission program, thereby functioning as the serial/parallel conversion (which will also be abbreviated to S/P) unit 31, the decoder 32 and the lateral-longitudinal conversion unit 33.

The S/P 31 converts the serial signals into the parallel signals containing the control signal indicating the delimiter of the data and the data signals as well.

The decoder 32 decodes the parallel signals. In the third embodiment, the parallel signals are decoded by the known 10B/8B conversion process.

The lateral-longitudinal conversion unit 33 lateral-longitudinal converts, based on the control signal, the data signals having the time slot count N with the bit N+α into the data signals having the time slot count N+α with the bit count N.

§2. Signal Transmission Method

Next, a signal transmission method executed based on the signal transmission program in the signal transmission device having the configuration described above, will be explained with reference to FIGS. 12 and 13.

The transmitting-side signal transmission device 60, when the parallel signals are inputted (S1), to begin with, converts data for 8 time slots of 7-bit parallel signals DI1–DI7 into 8-bit parallel data DI1–DI8 by use of the longitudinal-lateral conversion unit 31, then adds control signals (value K, 8 bits) inputted from the control signal add unit 12 into null time slots, and outputs the signals to the encoder 13 (S2).

The encoder 13 encodes the 8-bit parallel signals into 10-bit code trains (the parallel signals), and outputs the code train to the P/S 14 (S3). The code trains contain a code train of totally 512-tuples (256×2) of codes called the data codes and a code train of 20-tuples (10×2) of codes called as the control codes. The code train acquired by the 8B/10B conversion has a characteristic that normally a maximum number of sequences of 0 or 1 comes to only 4. However, especially 6-tuples (3×2) of codes among the control codes are called comma codes, and there exists a case in which the number of sequences of 0 or 1 comes to 5 only when transmitting these comma codes. The receiving side judges a byte delimiter of the serial data by detecting this, and thus restores a bit order.

The P/S 14 converts the 8B/10B-converted code train into the serial signals, and transmits the serial signals via the signal line 2 (S4).

On the other hand, the receiving-side signal transmission device 70, when receiving the serial signals (S5), at first, converts the transmitted serial signals into the 10-bit parallel signals by use of the S/P 31, and outputs the parallel signals to the decoder 32 (S6). At this time, the receiving-side signal transmission device 70 determines a parallel conversion timing by detecting the comma codes added by the transmitting side.

The decoder 32 restores the 10-bit parallel signals back to the 8-bit parallel signals by the 10B/8B conversion, and outputs the 8-bit parallel signals to the lateral-longitudinal conversion unit 33 (S7).

Then, the lateral-longitudinal conversion unit 33 lateral-longitudinal-converts the data signals for the 7 time slots that are delimited by the control signals among the 8-bit parallel signals, into 8-time-slot data of the original 7-bit parallel signals, and outputs these 7-bit parallel signals D01–D07 to a device provided at a posterior stage (S8).

As described above, according to the third embodiment, it is possible to transmit the signals in a way that converts the parallel signals containing the control signals into the serial signals without any delay by adding the control signals for reproducing the bit order into the null time created by the longitudinal-lateral conversion.

In particular, the third embodiment can be applied preferably to long-distance communications using the general-purpose computers.

FIRST MODIFIED EXAMPLE

The third embodiment has exemplified the configuration that the parallel signals are converted into one line of serial signals and thus transmitted by employing the general-purpose computers. The present invention is not, however, limited to this configuration. For instance, the parallel signals may be converted into plural rows of serial signals, and these plural rows of serial signals may be transmitted in parallel by using the general-purpose computers.

The present first modified example has, as compared with the third embodiment discussed above, substantially the same hardware configurations of the signal transmission devices 60, 70, and hence the repetitive explanations are omitted as by marking the same components with the same numerals, and so forth.

Note that an arithmetic processing unit 62 of the transmitting-side signal transmission device 60 actualizes a plurality of functions of each of the longitudinal-lateral conversion unit 11, the encoder 13 and the parallel-serial conversion unit 14 that are the same as those described above, whereby the parallel signals DI1–DI14 are converted into plural rows of serial signals DS1, DS2, and these plural rows of serial signals are transmitted in parallel (parallel transmissions) in the same way as FIG. 3 shows.

Moreover, an arithmetic processing unit 72 of the receiving-side signal transmission device 70 actualizes a plurality of functions of each of the serial/parallel conversion (S/P) unit 31, the decoder 32 and lateral-longitudinal conversion unit 33, and further actualizes the function of the delay adjusting unit 34 for adjusting the delay difference between the serial signals, whereby the serial signals DS1, DS2 are received, then converted into the parallel signals DI1–DI14 and thus outputted in the same way as FIG. 3 shows.

The signal transmission device 10 in the present embodiment inputs the control signals given from the control signal add unit 12 respectively to the parallel signals DI1–DI7 and DI8–DI14 inputted to the plurality of longitudinal-lateral conversion units 11 at the same timing. Owing to these control signals inputted, the receiving-side signal transmission device 30, when receiving the plural rows of serial signals DS1 and DS2, recognizes a delay difference Δdelay between the respective serial signals DS1 and DS2 on the basis of the control signals, and can acquire the parallel signals DO1–DO14 on a proper bit order by adjusting this delay difference.

Note that the specific delay difference adjusting procedure is the same as in the second modified example of the second embodiment discussed above.

It should be noted that the present invention is not limited to only the illustrated examples given above and can be, as a matter of course, modified in a variety of forms within the range that does not deviate from the gist of the present invention.

As discussed so far, according to the present invention, it is possible to provide the technology of simply performing the signal transmission via the less number of signal lines.

What is claimed is:

1. A signal transmission method comprising steps of:
longitudinal-lateral-converting data signals having a time slot count N+α with a bit count N into data signals having a time slot count N with a bit count N+α, and creating null time α;
adding a control signal into the null time α;
converting parallel signals containing the data signals and the control signal into serial signals; and
transmitting the serial signals.

2. A signal transmission method according to claim 1, wherein the parallel signals are, after being encoded, converted into the serial signals.

3. A signal transmission method according to claim 2 wherein the parallel signals are encoded by an 8B/10B conversion process.

4. A signal transmission method according to claim 1, wherein plural rows of serial signals are transmitted in parallel.

5. A signal transmission method according to claim 4, wherein the control signals are added into the plural rows of parallel signals at a predetermined timing.

6. A signal transmission method according to claim 5, wherein plural types of control signals are added in a way that changes an add interval for every type thereof.

7. A signal transmission method executing steps of:
receiving serial signals;
converting the serial signals into parallel signals containing a control signal indicating a data delimiter and data signals;

lateral-longitudinal-converting, based on the control signal, data signals having a time slot count N with a bit count N+α into data signals having a time slot count N+α with a bit count N; and a step of outputting the data signals after being converted.

8. A signal transmission method according to claim 7, wherein the parallel signals are decoded.

9. A signal transmission method according to claim 8, wherein the parallel signals are decoded by a 10B/8B conversion process.

10. A signal transmission method according to claim 7, wherein the plural rows of serial signals are received in parallel.

11. A signal transmission method according to claim 10, wherein a delay difference is obtained based on the control signals added to the plural rows of parallel signals at a predetermined timing, and the plural rows of parallel signals are outputted based on this delay difference.

12. A signal transmission method according to claim 11, wherein a phase difference is obtained based on plural types of control signals added in a way that changes an add interval for every type thereof.

13. A signal transmission device comprising:
a longitudinal-lateral conversion unit longitudinal-lateral-converting data signals having a time slot count N+α with a bit count N into data signals having a time slot count N with a bit count N+α, and creating null time α;
a control signal add unit adding a control signal into the null time α; and
a parallel-serial conversion unit converting parallel signals containing the data signals and the control signal into serial signals, and outputting the serial signals.

14. A signal transmission device according to claim 13, further comprising an encoder encoding the parallel signals.

15. A signal transmission device according to claim 14, wherein said encoder encodes the parallel signals by an 8B/10B conversion process.

16. A signal transmission device according to claim 13, wherein plural rows of serial signals are transmitted in parallel.

17. A signal transmission device according to claim 13, wherein said control signal add unit adds the control signals to the plural rows of parallel signals at a predetermined timing.

18. A signal transmission device according to claim 17, wherein said control signal add unit adds plural types of control signals in a way that changes an add interval for every type thereof.

19. A signal transmission device comprising:
a serial/parallel-converting unit converting serial signals into parallel signals containing a control signal indicating a data delimiter and data signals; and
a lateral-longitudinal-converting unit lateral-longitudinal-converting, based on the control signal, data signals having a time slot count N with a bit count N+α into data signals having a time slot count N+α with a bit count N, and outputting the data signals.

20. A signal transmission device according to claim 19, further comprising a decoder decoding the parallel signals.

21. A signal transmission device according to claim 20, wherein said decoder decodes the parallel signals by a 10B/8B conversion process.

22. A signal transmission device according to claim 20, wherein said receiving unit receives the plural rows of serial signals in parallel.

23. A signal transmission device according to claim 22, further comprising a delay adjusting unit obtaining a delay difference on the basis of the control signals added at a predetermined timing to the plural rows of parallel signals, and adjusting this delay difference.

24. A signal transmission device according to claim 23, wherein said delay adjusting unit obtains a phase difference on the basis of the plural types of control signals added in a way that changes an add interval for every type thereof.

* * * * *